United States Patent
Chiu et al.

(10) Patent No.: US 11,197,397 B2
(45) Date of Patent: Dec. 7, 2021

(54) PROVISIONING DATA CENTER SERVER COOLING EQUIPMENT

(71) Applicant: Google LLC, Mountain View, CA (US)

(72) Inventors: Jerry Chiu, Pacifica, CA (US); Skyler Salman, Charleston, SC (US); Madhusudan Krishnan Iyengar, Foster City, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 17/095,554

(22) Filed: Nov. 11, 2020

(65) Prior Publication Data

US 2021/0068309 A1    Mar. 4, 2021

Related U.S. Application Data

(62) Division of application No. 16/250,418, filed on Jan. 17, 2019, now Pat. No. 10,869,412.

(60) Provisional application No. 62/775,513, filed on Dec. 5, 2018.

(51) Int. Cl.
   *H05K 7/20* (2006.01)
(52) U.S. Cl.
   CPC ..... *H05K 7/20781* (2013.01); *H05K 7/20145* (2013.01); *H05K 7/20272* (2013.01); *H05K 7/20281* (2013.01); *H05K 7/20736* (2013.01)
(58) Field of Classification Search
   CPC .......... H05K 7/20781; H05K 7/20145; H05K 7/20272; H05K 7/20281; H05K 7/20736
   USPC ...................................................... 165/80.4
   See application file for complete search history.

(56) References Cited

U.S. PATENT DOCUMENTS

| | | | |
|---|---|---|---|
| 4,513,696 A | 4/1985 | Fujii et al. | |
| 5,293,754 A * | 3/1994 | Mizuno | H01L 23/473 165/104.27 |
| 6,161,578 A * | 12/2000 | Braun | F16L 37/0841 137/614.03 |
| 7,043,933 B1 | 5/2006 | Knight | |
| 7,508,665 B1 * | 3/2009 | Palmer | H05K 7/2079 361/696 |

(Continued)

OTHER PUBLICATIONS

PCT International Search Report and Written Opinion in International Application No. PCT/US2019/044409, dated Oct. 25, 2019, 14 pages.

(Continued)

*Primary Examiner* — Jon T. Schermerhorn, Jr.
(74) *Attorney, Agent, or Firm* — Fish & Richardson P.C.

(57) ABSTRACT

Systems and methods for data center liquid cooling apparatus provisioning are described. In some aspects, such systems and methods may provision one or more data center liquid cooling apparatus, e.g., prior to such apparatus being put into service to a data center to cool data center devices, such as server trays (and more specifically, heat-generating devices such as processors, memories, voltage regulators, and other devices mounted on motherboards of the server trays). In some aspects, such liquid cooling apparatus include cold plates or evaporators that are mounted in thermal communication with the heat generating devices (in the server trays) and utilize a flow of a cooling liquid (e.g., water, glycol, refrigerant) to remove heat from the server tray (e.g., with or without a phase change of the cooling liquid).

20 Claims, 5 Drawing Sheets

(56) References Cited

U.S. PATENT DOCUMENTS

| | | | |
|---|---|---|---|
| 8,500,419 B2* | 8/2013 | Scarsdale | F04B 35/04 |
| | | | 417/423.3 |
| 8,813,513 B2* | 8/2014 | Simadiris | B64D 11/04 |
| | | | 62/185 |
| 8,820,351 B1* | 9/2014 | Harrington | G06F 1/20 |
| | | | 137/595 |
| 9,010,141 B2 | 4/2015 | Harrington | |
| 9,161,480 B2* | 10/2015 | Harrington | F28F 1/16 |
| 9,924,614 B2* | 3/2018 | Suzuki | H05K 7/20272 |
| 9,980,415 B2* | 5/2018 | Zhou | H05K 7/20927 |
| 2005/0122685 A1* | 6/2005 | Chu | H05K 7/2079 |
| | | | 361/699 |
| 2005/0126747 A1 | 6/2005 | Chu | |
| 2007/0193721 A1 | 8/2007 | Tilton et al. | |
| 2012/0180979 A1 | 7/2012 | Harrington | |

OTHER PUBLICATIONS

PCT International Preliminary Report on Patentability in International Application No. PCT/US2019/044409, dated Jun. 17, 2021, 9 pages.

* cited by examiner

PROVISIONING DATA CENTER SERVER COOLING EQUIPMENT

CROSS-REFERENCE TO RELATED APPLICATIONS

This application is a divisional of U.S. patent application Ser. No. 16/250,418, filed on Jan. 17, 2019, which claims priority under 35 U.S.C. § 119 to U.S. Provisional Patent Application Ser. No. 62/775,513, filed on Dec. 5, 2018, the entire contents of which are incorporated by reference herein.

TECHNICAL FIELD

This document relates to systems and methods for provisioning data center cooling equipment, such as liquid cooling apparatus for computer server racks and related equipment in computer data centers.

BACKGROUND

Computer users often focus on the speed of computer microprocessors (e.g., megahertz and gigahertz). Many forget that this speed often comes with a cost—higher power consumption. This power consumption also generates heat. That is because, by simple laws of physics, all the power has to go somewhere, and that somewhere is, in the end, conversion into heat. A pair of microprocessors mounted on a single motherboard can draw hundreds of watts or more of power. Multiply that figure by several thousand (or tens of thousands) to account for the many computers in a large data center, and one can readily appreciate the amount of heat that can be generated. The effects of power consumed by the critical load in the data center are often compounded when one incorporates all of the ancillary equipment required to support the critical load. In some instances, a liquid coolant may be circulated to liquid cooling apparatus, such as cold plates, that are in thermal communication with the heat generating devices in a data center.

SUMMARY

In an example implementation, a data center liquid cooling apparatus provisioning system includes a housing that defines a volume that is at least partially accessible through one or more openings of the housing, a cooling liquid flow circuit at least partially enclosed within the volume, and a control system communicably coupled to the cooling liquid flow circuit. The cooling liquid flow circuit includes a cooling liquid supply tank configured to store a volume of a cooling liquid; a pump coupled to the cooling liquid supply tank and coupled to an outlet configured to connect to a data center liquid cooling apparatus; a cooling liquid waste tank coupled to an inlet configured to connect to the data center liquid cooling apparatus; and a sensor in fluid communication with the cooling liquid flow circuit and configured to sense a liquid fill amount of the data center liquid cooling apparatus. The control system is configured to perform operations including operating the pump to circulate a volume of the cooling liquid from the cooling liquid supply tank to the data center liquid cooling apparatus sufficient to at least fill the data center liquid cooling apparatus; and based on the sensor indicating that the fill amount of the data center liquid cooling apparatus is above a threshold value, stopping operation of the pump.

In an aspect combinable with the example implementation, the cooling liquid flow circuit further includes at least one liquid filter positioned between the cooling liquid supply tank and the outlet.

In an aspect combinable with any of the previous aspects, the data center liquid cooling apparatus includes a liquid cold plate or evaporator configured to thermally couple to one or more data center heat generating devices.

In an aspect combinable with any of the previous aspects, the pump includes a peristaltic pump.

In an aspect combinable with any of the previous aspects, the cooling liquid flow circuit further includes a first quick disconnect positioned at the outlet and a second quick disconnect positioned at the inlet.

In an aspect combinable with any of the previous aspects, the control system is configured to perform operations further including determining that the sensor indicates that the fill amount of the data center liquid cooling apparatus is below a threshold value; operating the pump to circulate at least a portion of the cooling liquid from the cooling liquid supply tank, through the data center liquid cooling apparatus, and into the cooling liquid waste tank; and based on the sensor indicating that the fill amount of the data center liquid cooling apparatus is above a threshold value, stopping operation of the pump.

In an aspect combinable with any of the previous aspects, the sensor includes a pressure sensor configured to measure a fluid pressure of the cooling liquid in at least one of the cooling liquid flow circuit or the data center cooling device.

In an aspect combinable with any of the previous aspects, the control system is configured to perform operations further including operating the pump to circulate the volume of the cooling liquid from the cooling liquid supply tank to the data center liquid cooling apparatus to evacuate at least a portion of a gas inside the data center liquid cooling apparatus into the cooling liquid waste tank.

In an aspect combinable with any of the previous aspects, the cooling liquid flow circuit further includes one or more one-way check valves configured to permit a flow of the cooling liquid through the cooling liquid flow circuit in a single direction.

In an aspect combinable with any of the previous aspects, a first check valve of the one or more check valves is positioned between a filter of the cooling liquid flow circuit and the inlet, and a second check valve of the one or more check valves is positioned between the inlet and the cooling liquid waste tank.

An aspect combinable with any of the previous aspects further includes a data center liquid cooling apparatus evacuation assembly fluidly coupled to the cooling liquid flow circuit.

In an aspect combinable with any of the previous aspects, the data center liquid cooling apparatus evacuation assembly includes an air compressor; a pressurized air reservoir fluidly connected to the air compressor; an air outlet fluidly connected to the outlet of the cooling liquid flow circuit; and an air valve fluidly connected between the pressurized air reservoir and the air outlet.

In an aspect combinable with any of the previous aspects, the control system is configured to perform operations further including operating the air compressor to circulate pressurized air into the pressurized air reservoir; operating the air valve to release pressurized air through the air outlet, through the outlet of the cooling liquid flow circuit, and into the data center liquid cooling apparatus.

In an aspect combinable with any of the previous aspects, the cooling liquid waste tank is fluidly connected to the air outlet to receive a mixture of cooling liquid and pressurized air from the data center liquid cooling apparatus during flow of the released pressurized air.

In another example implementation, a method for provisioning a data center liquid cooling apparatus includes fluidly connecting a liquid inlet data center liquid cooling apparatus to an outlet of a data center liquid cooling apparatus provisioning system and fluidly connecting a liquid outlet of the data center liquid cooling apparatus to an inlet of the data center liquid cooling apparatus provisioning system. The data center liquid cooling apparatus provisioning system includes a cooling liquid supply tank, a pump coupled to the cooling liquid supply tank and coupled to the outlet, and a sensor in fluid communication with at least one of the inlet or the outlet. The method also includes operating the pump to circulate a volume of a cooling liquid from the cooling liquid supply tank to the data center liquid cooling apparatus sufficient to at least fill the data center liquid cooling apparatus and based on the sensor indicating that a fill amount of the data center liquid cooling apparatus is above a threshold value, stopping operation of the pump.

An aspect combinable with the example implementation further includes circulating the volume of the cooling liquid through at least one liquid filter prior to circulating the volume of the cooling liquid to the data center liquid cooling apparatus.

In an aspect combinable with any of the previous aspects, the data center liquid cooling apparatus includes a liquid cold plate or evaporator configured to thermally couple to one or more data center heat generating devices.

In an aspect combinable with any of the previous aspects, the pump includes a peristaltic pump.

In an aspect combinable with any of the previous aspects, the data center liquid cooling apparatus provisioning system further includes a first quick disconnect positioned at the outlet and a second quick disconnect positioned at the inlet.

An aspect combinable with any of the previous aspects further includes determining that the sensor indicates that the fill amount of the data center liquid cooling apparatus is below a threshold value; operating the pump to circulate at least a portion of the cooling liquid from the cooling liquid supply tank, through the data center liquid cooling apparatus, and into a cooling liquid waste tank of the data center liquid cooling apparatus provisioning system; and based on the sensor indicating that the fill amount of the data center liquid cooling apparatus is above a threshold value, stopping operation of the pump.

In an aspect combinable with any of the previous aspects, the sensor includes a pressure sensor.

An aspect combinable with any of the previous aspects further includes measuring, with the sensor, a fluid pressure of the cooling liquid in at least one of the cooling liquid flow circuit or the data center cooling device; and determining the fill amount based on the measured fluid pressure An aspect combinable with any of the previous aspects further includes operating the pump to circulate the volume of the cooling liquid from the cooling liquid supply tank to the data center liquid cooling apparatus to evacuate at least a portion of a gas inside the data center liquid cooling apparatus into the cooling liquid waste tank.

In an aspect combinable with any of the previous aspects, the data center liquid cooling apparatus provisioning system further includes one or more one-way check valves configured to permit a flow of the cooling liquid in a single direction.

In an aspect combinable with any of the previous aspects, a first check valve of the one or more check valves is positioned between a filter of the data center liquid cooling apparatus provisioning system and the inlet, and a second check valve of the one or more check valves is positioned between the inlet and a cooling liquid waste tank.

An aspect combinable with any of the previous aspects further includes evacuating an amount of cooling liquid from the data center liquid cooling apparatus with an evacuation assembly of the data center liquid cooling apparatus provisioning system that is fluidly coupled to the outlet.

In an aspect combinable with any of the previous aspects, the evacuation assembly includes an air compressor; a pressurized air reservoir fluidly connected to the air compressor; an air outlet fluidly connected to the outlet of the cooling liquid flow circuit; and an air valve fluidly connected between the pressurized air reservoir and the air outlet.

An aspect combinable with any of the previous aspects further includes operating the air compressor to circulate pressurized air into the pressurized air reservoir; and operating the air valve to release pressurized air through the air outlet, through the outlet of the cooling liquid flow circuit, and into the data center liquid cooling apparatus.

In an aspect combinable with any of the previous aspects, a cooling liquid waste tank is fluidly connected to the air outlet to receive a mixture of cooling liquid and pressurized air from the data center liquid cooling apparatus during flow of the released pressurized air.

Various implementations of a data center cooling equipment provisioning system according to the present disclosure may include one, some, or all of the following features. For example, a data center cooling equipment provisioning system according to the present disclosure may provide for an efficient system and process for charging (e.g., with a cooling liquid) a server liquid cooling system (e.g., a cold plate, evaporator, and other related equipment) at various stages to mitigate risks typically involved with preparing such equipment for operation. As another example, a data center cooling equipment provisioning system according to the present disclosure may allow for such cooling equipment to be pre-charged and pressurized with liquid prior to installation, e.g., in a server rack or in a server tray assembly. As a further example, a data center cooling equipment provisioning system according to the present disclosure may mitigate air entrainment resulting in a loss of heat transfer capability, and pump damage through cavitation. As yet another example, a data center cooling equipment provisioning system according to the present disclosure may provide for both charging and discharging the liquid cooling equipment, for example, during commissioning and decommissioning, respectively. As another example, a data center cooling equipment provisioning system according to the present disclosure may mitigate air entrainment in the cooling system that can result in unwetted areas of the internal pipes, manifolds, and couplings that are susceptible to corrosion and bio-growth, e.g., contamination.

The details of one or more embodiments are set forth in the accompanying drawings and the description below. Other features, objects, and advantages will be apparent from the description and drawings, and from the claims.

DETAILED DESCRIPTION

Figure 1:
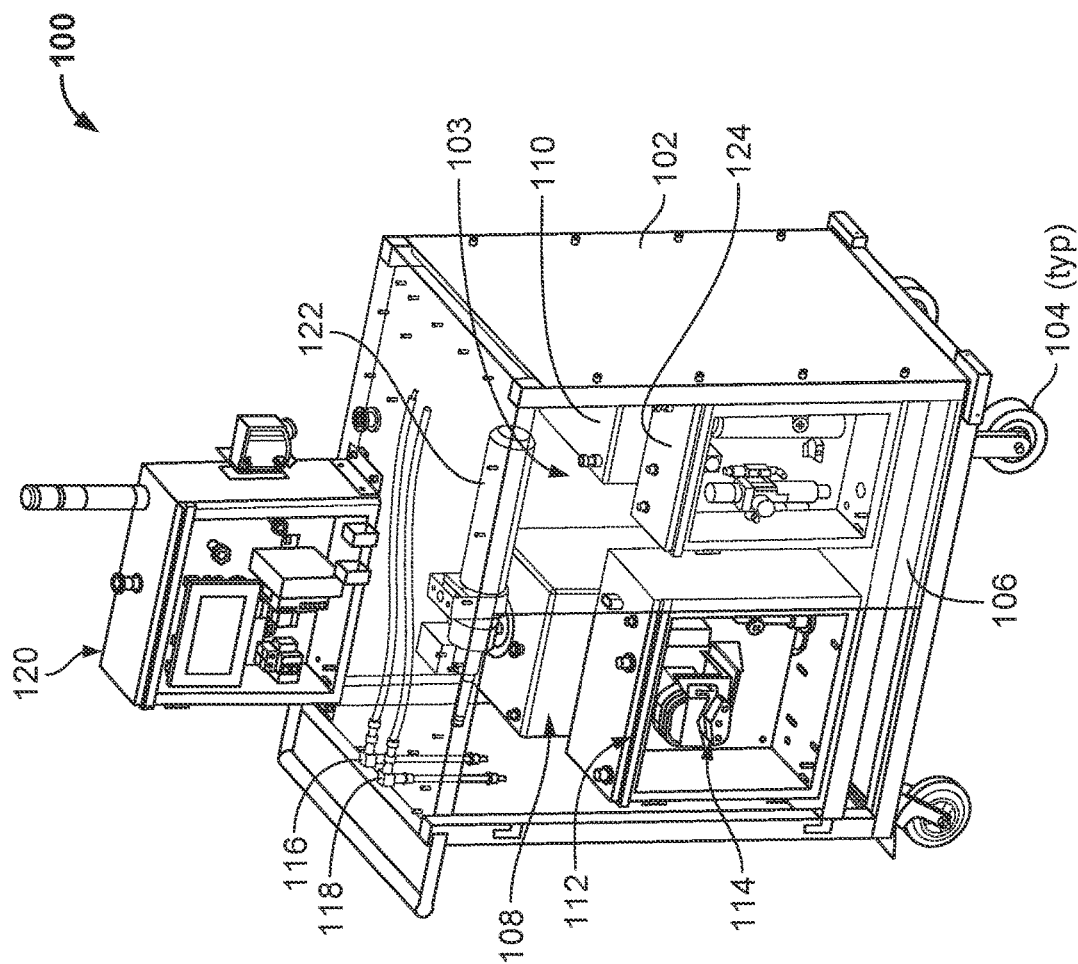
FIG. 1 illustrates an isometric view of an example implementation of a data center liquid cooling apparatus provisioning system according to the present disclosure.

FIG. 1 illustrates an isometric view of an example implementation of a data center liquid cooling apparatus provisioning system 100 ("system 100"). In some aspects, the system 100 may operate or be operated to provision one or more data center liquid cooling apparatus, e.g., prior to such apparatus being put into service to a data center to cool data center devices, such as server trays (and more specifically, heat-generating devices such as processors, memories, voltage regulators, and other devices mounted on motherboards of the server trays). In some aspects, such liquid cooling apparatus include cold plates or evaporators that are mounted in thermal communication with the heat generating devices (in the server trays) and utilize a flow of a cooling liquid (e.g., water, glycol, refrigerant) to remove heat from the server tray (e.g., with or without a phase change of the cooling liquid).

During typical operation of the liquid cooling apparatus, the cooling liquid is circulated, e.g., at a particular flow rate and fluid pressure, to cool the server tray. Prior to typical operation, the system 100 may be operated to provision many (e.g., tens, hundreds, thousands, tens of thousands) liquid cooling apparatus by pre-filling each apparatus with a particular amount of cooling liquid at a particular fluid pressure such that initiation of the typical operation of the liquid cooling apparatus is more efficient with fewer issues. For example, by pre-filling each apparatus with cooling liquid (e.g., to a particular fill amount and fluid pressure), the system 100 may reduce an amount of air in each liquid cooling apparatus (and the overall data center cooling system that includes many such apparatus as well as return and supply manifolds, pumps, and other liquid carrying conduits). By reducing such air, cavitation of the pumps in the overall data center cooling system may be reduced as well.

By provisioning each liquid cooling apparatus with the system 100, installation and start-up time periods of the liquid cooling apparatus in the server trays (and server racks which hold the server trays) may be minimized. Further, in some aspects, "provisioning" the liquid cooling apparatus by the system 100 may also include decommissioning the liquid cooling apparatus by removing any remaining cooling liquid present in the apparatus subsequent to shut-down of the apparatus (e.g., for maintenance, cleaning, or otherwise).

As shown in FIG. 1, the system 100 includes a housing 102 (in this example, a cart, with the top shown as "invisible" in the figure so as to illustrate components therewithin) that is mounted on one or more casters 104 (or other form of rollers or wheels) and includes a volume 103 in which one or more components of the system 100 are at least partially enclosed. Although not shown in this figure, one or more doors may be mounted on sides of the housing 102 to allow access to the volume 103.

In this example, cooling liquid supply tank 108 is mounted within the volume 103 and can store a volume of cooling liquid to be provisioned to one or more liquid cooling apparatus. In some aspects, the volume of cooling liquid stored in the tank 108 may be sufficient to fill tens or even hundreds of liquid cooling apparatus with cooling liquid during a commissioning process (described, e.g., with reference to FIG. 3). A cooling liquid waste tank 110 is also stored at least partially in the volume 103. The cooling liquid waste tank 110 can store a volume of waste cooling liquid, e.g., cooling liquid evacuated from one or more liquid cooling apparatus during a decommissioning process (described, e.g., with reference to FIG. 4). Waste cooling liquid can also include an amount of cooling liquid that flows through a liquid cooling apparatus and to the waste tank 110 during the commissioning process (e.g., overfill liquid). As shown, a drip pan 106 is positioned in the volume 103 underneath the tanks 108 and 110 to, for example, catch and contain any liquid leakage from the components in the volume 103. Further, in some aspects, one or more load cells (not shown) may be positioned under the tanks 108 and 110 (individually or both). In some aspects, a volume of liquid in one or both of the tanks 108 and 110 may be approximated by respective float-type sensors that are triggered when the volume of working fluid in the particular tank drops below a minimum volume (e.g., for the supply tank 108) or rises above a maximum value (e.g., for the waste tank 110).

An enclosure 112 (e.g., a NEMA-rated enclosure), in this example implementation, is positioned in the volume 103. The enclosure 112, as shown, includes a pump 114 that is in fluid communication with the cooling liquid supply tank 108 and the cooling liquid waste tank 110. In some aspects, the pump 114 may be more than one pump. In some aspects, the pump 114 is a peristaltic pump that, for example, does not require priming before operation.

The system 100 also includes an outlet 116 and an inlet 118, each of which is fluidly coupled to the pump 114, the cooling liquid supply tank 108, and the cooling liquid waste tank 110. In some aspects, the outlet 116 is connectable to a fluid inlet of the liquid cooling apparatus. The inlet 118 is connectable to a fluid outlet of the liquid cooling apparatus. One or both of the outlet 116 and the inlet 118 may include a fluid disconnect valve, such as a shut-off valve or quick disconnect. The quick disconnects may be dripless disconnects, such that upon disconnect between the outlet 116 (and fluid inlet) or the inlet 118 (and fluid outlet), no or negligible cooling liquid escapes the respective outlet 116 and inlet 118.

In this example, a liquid filter 122 is enclosed in the volume 103 and fluidly coupled to the pump 114, tanks 108 and 110, the outlet 116, and the inlet 118. In some aspects, the filter 122 is between a 5-10 micron barrel filter that filters a flow of the cooling liquid stored in the supply tank 108 to the liquid cooling apparatus.

The example implementation of the system 100 also includes a flow control enclosure 124. The flow control enclosure 124 may store or include, for example, flow control fittings and devices for the system 100, such as check valves, solenoid valves, pressure sensors, or other flow control devices. In some aspects, the flow control enclosure 124 may also include a compressed gas evacuation subsystem (not shown) of the system 100 (explained in more detail with reference to FIG. 2).

In the example implementation of system 100 shown in FIG. 1, the tanks 108 and 110, the pump 114, the filter 122, the outlet 118, the inlet 116, and possibly one or more flow control devices enclosed in the flow control enclosure 124 comprise a cooling liquid flow circuit. Operation of the components of the cooling liquid flow circuit may be controlled, e.g., by the HMI 120 shown in FIG. 1. In some aspects, HMI 120 is or comprises a flow control system that is communicably coupled to the components of the cooling liquid flow circuit. HM 120, in some aspects, includes a micro-processor based control system that includes hardware, software, or firmware, or a combination thereof, to control operations of the cooling liquid flow circuit. In alternative aspects, the HMI 120 may be a mechanical, electro-mechanical, or pneumatic control system. In some aspects, parameters of the cooling liquid flow circuit that are available on or to the HMI 120 include cooling liquid pressure (e.g., in PSI), desired cooling liquid pressure, pump motor speed, historical data, and filter differential pressure (e.g., for filter maintenance or replacement purposes).

In an example operation using the HMI 120, a fill or commissioning operation for a liquid cooling apparatus may be performed. For example, a fill operation will pressurize the liquid cooling apparatus until a desired fluid pressure (programmed into the HMI 120) is reached. First, the system 100 is powered on (e.g., with electrical power). Next, the liquid cooling apparatus to be filled is fluidly coupled (e.g., to outlet 116 and inlet 118) of the system 100. Next, a fill mode operation is engaged at the HMI 120, which circulates cooling liquid from the supply tank 108 to the liquid cooling apparatus. In some aspects, gas (such as air) in the liquid cooling apparatus is pushed out by the cooling liquid into the waste tank 110. The HMI 120 indicates that a fill operation is ongoing. In some aspects, a fill operation may run for several seconds during which time the cooling liquid (e.g., from tank 108) is circulated through the liquid cooling apparatus and air (from the apparatus) is expelled. The entrapped air and some small volume of cooling liquid is drained into the waste tank 110. After a pre-set time (e.g., set in the HMI 120), a solenoid which is positioned between the liquid cooling apparatus and the waste tank 108 is closed. The pump 114 continues to run during this time, increasing the pressure in this hydraulic segment which includes the liquid cooling apparatus.

Next, when the liquid cooling apparatus has been pressurized (e.g., to the desired fluid pressure) with the cooling liquid, the HMI 120 prompts removal of the liquid cooling apparatus (from the outlet 116 and inlet 118). In the case of a problem during the fill operation, the operation can be halted engagement of a stop button on the HMI 120.

In another example operation using the HMI 120, an evacuation or decommissioning operation for a liquid cooling apparatus may be performed. For example, an evacuation operation will remove any cooling liquid stored or remaining in the liquid cooling apparatus. First, the system 100 is powered on (e.g., with electrical power). Next, the liquid cooling apparatus to be evacuated is fluidly coupled (e.g., to outlet 116 and inlet 118) of the system 100. Next, an evacuation mode operation is engaged at the HMI 120, which circulates a pressurized gas from the compressed gas evacuation sub-system to the liquid cooling apparatus. Cooling liquid in the liquid cooling apparatus is pushed out by the compressed gas into the waste tank 110. The HMI 120 indicates that an evacuation operation is ongoing. Next, when the liquid cooling apparatus has been evacuated with the compressed gas, the HMI 120 prompts removal of the liquid cooling apparatus (from the outlet 116 and inlet 118). In the case of a problem during the evacuation operation, the operation can be halted engagement of a stop button on the HMI 120. In some aspects, the evacuation operation is programmed (e.g., in the HMI 120) to run for a specified period of time.

In another example operation using the HMI 120, a continuous fill or commissioning operation for multiple liquid cooling apparatus may be performed. For example, a continuous fill operation will pressurize multiple liquid cooling apparatus, fluidly connected one-by-one, until a desired fluid pressure (programmed into the HMI 120) is reached in each apparatus. First, the system 100 is powered on (e.g., with electrical power). Next, the liquid cooling apparatus to be filled is fluidly coupled (e.g., to outlet 116 and inlet 118) of the system 100. Next, a fill mode operation is engaged at the HMI 120, which circulates cooling liquid from the supply tank 108 to the multiple liquid cooling apparatus (fluidly connected in series). In some aspects, gas (such as air) in the multiple liquid cooling apparatus is pushed out by the cooling liquid into the waste tank 110. The HMI 120 indicates that a continuous fill operation is ongoing. In the case of a problem during the continuous fill operation, the operation can be halted engagement of a stop button on the HMI 120.

In another example operation using the HMI 120, a continuous evacuation or decommissioning operation for multiple liquid cooling apparatus may be performed. For example, a continuous evacuation operation will remove any cooling liquid stored or remaining in multiple, serially coupled, liquid cooling apparatus. First, the system 100 is powered on (e.g., with electrical power). Next, the multiple liquid cooling apparatus to be evacuated are fluidly coupled in series and to (e.g., to outlet 116 and inlet 118) the system 100. Next, a continuous evacuation mode operation is engaged at the HMI 120, which circulates a pressurized gas from the compressed gas evacuation sub-system to the multiple liquid cooling apparatus. Cooling liquid in the multiple liquid cooling apparatus is pushed out by the compressed gas into the waste tank 110. The HMI 120 indicates that a continuous evacuation operation is ongoing. Next, when the multiple liquid cooling apparatus has been evacuated with the compressed gas, the HMI 120 prompts removal of the liquid cooling apparatus (from the outlet 116 and inlet 118). In the case of a problem during the continuous evacuation operation, the operation can be halted engagement of a stop button on the HMI 120.

In some aspects, the continuous evacuation operation is programmed (e.g., in the HMI 120) to run for a specified period of time. Alternatively, in some aspects, the continuous evacuation operation may continue as long as an operator (e.g., of the HMI 120) allows. For example, the operator can determine whether to terminate the continuous evacuation operation by visually inspecting the waste tank 110 to verify that cooling liquid is no longer being emptied into the tank 110. Alternatively, if using transparent accessory hoses with the system 100, the operator can visually inspect to see if cooling liquid is still circulating through the hoses into the waste tank 110. The operator may then manually terminate the operation when there is no more cooling liquid flowing into the waste tank 110.

Figure 2:
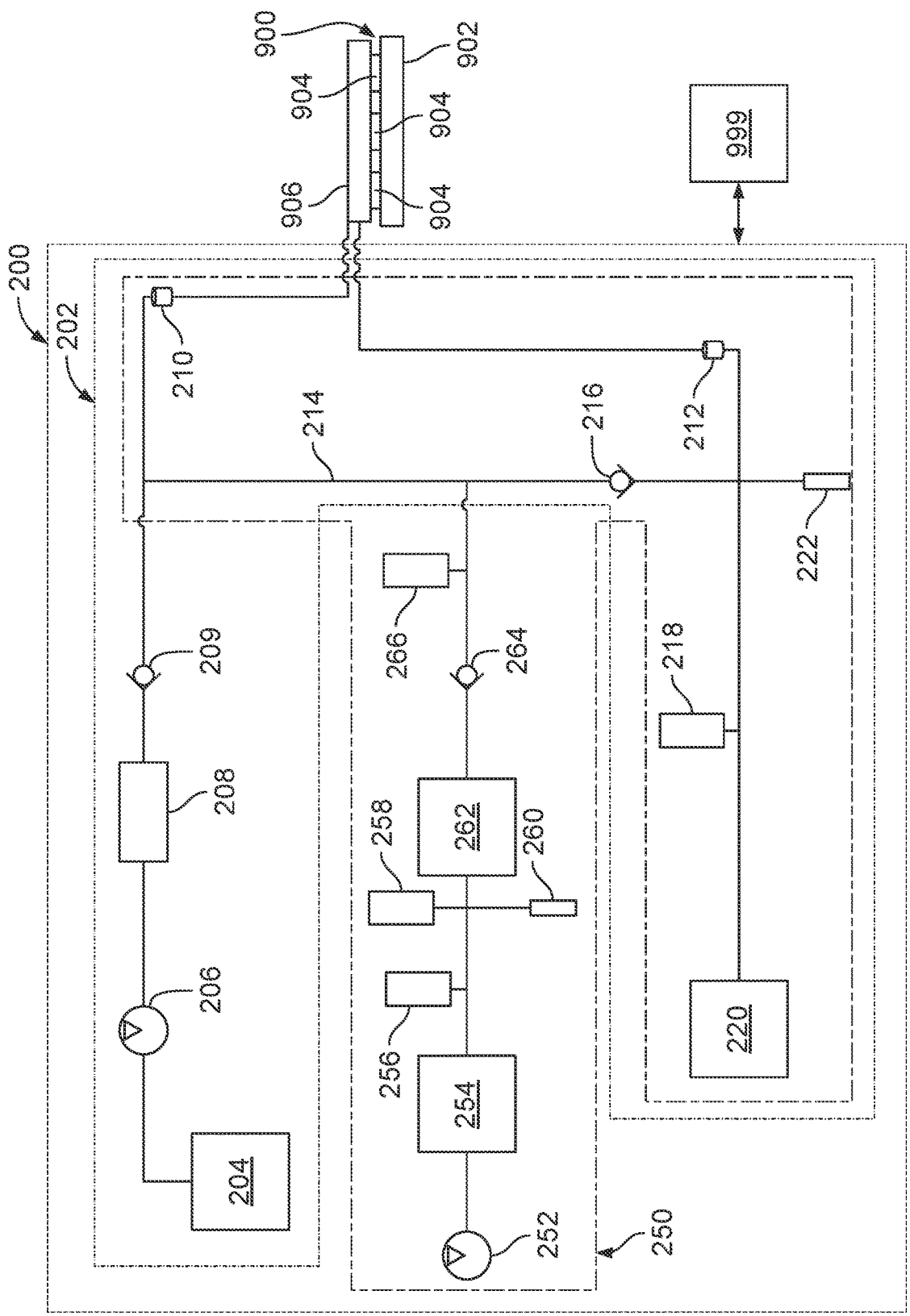
FIG. 2 illustrates a schematic drawing of an example implementation of a data center liquid cooling apparatus provisioning system according to the present disclosure.

FIG. 2 illustrates a schematic drawing of an example implementation of a data center liquid cooling apparatus provisioning system 200 ("system 200"). In some aspects, the system 200 may operate or be operated to provision one or more data center liquid cooling apparatus, e.g., prior to such apparatus being put into service to a data center to cool data center devices, such as server trays (and more specifically, heat-generating devices such as processors, memories, voltage regulators, and other devices mounted on motherboards of the server trays). In some aspects, such liquid cooling apparatus include cold plates or evaporators that are mounted in thermal communication with the heat generating devices (in the server trays) and utilize a flow of a cooling liquid (e.g., water, glycol, refrigerant) to remove heat from the server tray (e.g., with or without a phase change of the cooling liquid).

During typical operation of the liquid cooling apparatus, the cooling liquid is circulated, e.g., at a particular flow rate and fluid pressure, to cool the server tray. Prior to typical operation, the system 100 may be operated to provision many (e.g., tens, hundreds, thousands, tens of thousands) liquid cooling apparatus by pre-filling each apparatus with a particular amount of cooling liquid at a particular fluid pressure such that initiation of the typical operation of the liquid cooling apparatus is more efficient with fewer issues. For example, by pre-filling each apparatus with cooling liquid (e.g., to a particular fill amount and fluid pressure), the system 100 may reduce an amount of air in each liquid cooling apparatus (and the overall data center cooling system that includes many such apparatus as well as return and supply manifolds, pumps, and other liquid carrying conduits). By reducing such air, cavitation of the pumps in the overall data center cooling system may be reduced as well.

In this example implementation, the system 200 is shown fluidly coupled to an example liquid cooling apparatus 906 that is mounted in thermal contact with one or more heat generating devices 904 (e.g., processors, memory modules, etc.) on a motherboard 902 of a server tray (or server tray package) 900. In some aspects, the liquid cooling apparatus 906 is a cold plate heat exchanger or evaporator in which a cooling liquid flows into the apparatus 906, receives heat generated by the devices 904, and flows out of the apparatus 906 (e.g., at a higher temperature and/or a different phase).

The example implementation of system 200 also includes a control system 999, which is shown communicably coupled to the system 200 (and therefore communicably coupled to one or more components of each of the cooling liquid flow circuit 202 and the gas evacuation sub-assembly 250). In some aspects, the control system 999 may be a mechanical or electro-mechanical control system. Alternatively, the control system 999 may be a pneumatic control system. Alternatively, the control system 999 may be a micro-processor based control system, with control instructions stored on computer-readable non-transitory media and operable to be executed by one or more hardware processors.

As shown, the system 200 includes a cooling liquid flow circuit 202 (indicated by a dotted-dashed line) and a gas evacuation assembly 250 (shown by the dash-dash line). In some aspects, one or more components may be part of each of the flow circuit 202 and the gas evacuation assembly 250. Thus, other implementations of the system 200 may have a different combination of components in each of the flow circuit 202 and the gas evacuation sub-assembly 250 (or a number of components not delineated by either the flow circuit 202 or the gas evacuation sub-assembly 250).

The flow circuit 202, in this example implementation, includes: a cooling liquid supply tank 204, which is fluidly coupled to a pump 206, which is fluidly coupled to a liquid filter 208, which is fluidly coupled to a check valve 209, which is fluidly coupled to an outlet 210. In some aspects, the cooling liquid supply tank 204 can hold enough cooling liquid to sufficiently fill (e.g., commission), e.g., tens to hundreds, of liquid cooling apparatus 906 without refilling. In some aspects, the pump 206 is a centrifugal, electric submersible, or peristaltic pump. In some aspects, the liquid filter 208 is a 5-20 micron barrel-type filter.

As shown, outlet 210 is fluidly connected to the liquid cooling apparatus 906 (e.g., either directly or through another fluid conduit). In some aspects, the outlet 210 may include or comprise a fluid disconnect, such as a dripless quick disconnect. The outlet 210 connects to an inlet of the liquid cooling apparatus 906.

The flow circuit 202, in this example implementation, also includes: an inlet 212, which is fluidly connected to a solenoid valve 218, which is fluidly connected to a cooling liquid waste tank 220. Further, a sensor 222 (e.g., a fill sensor, pressure sensor, or flow sensor) is fluidly coupled to a junction in which a bypass line 214 fluidly connects the outlet 210 and the inlet 212. The inlet 212 is fluidly coupled to an outlet of the liquid cooling apparatus 906. In some aspects, the inlet 212 may also include or comprise a fluid disconnect, such as a dripless quick disconnect.

The pressurized gas evacuation sub-assembly 250, in this example, includes: a compressor 252, which is fluidly coupled to a pressure regulator 254, which is fluidly coupled to a solenoid valve 256, which is fluidly coupled to a pressure relief valve 258 and gas pressure sensor 260, which is fluidly coupled to a pressurized gas reservoir 262, which is fluidly coupled to a check valve 264, which is fluidly coupled to a solenoid valve 266, which is fluidly coupled to the outlet 210 (through bypass line 214).

The pressurized gas evacuation sub-assembly 250, in this example implementation, also includes: the inlet 212, which is fluidly connected to the solenoid valve 218, which is fluidly connected to the cooling liquid waste tank 220.

Figure 3:
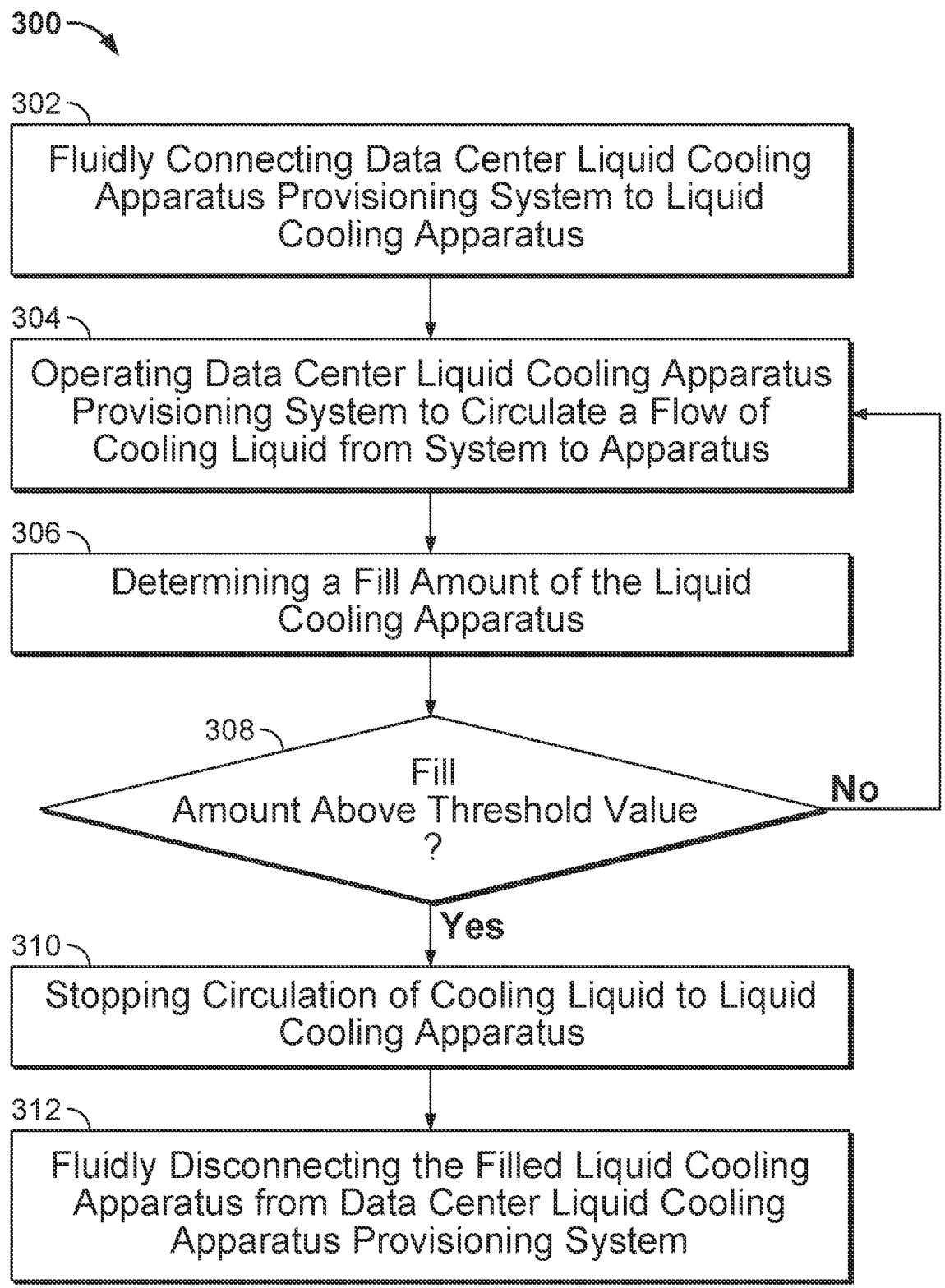
FIG. 3 illustrates an example method performed with a data center liquid cooling apparatus provisioning system according to the present disclosure.

Turning to FIG. 3, this figure illustrates an example method 300 performed with a data center liquid cooling apparatus provisioning system, such as the system 200. In some aspects, the method 300 may be performed by or with the control system 999. In some aspects, method 300 is an example of a fill or commissioning operation, in which the system 200 is operated to fill the liquid cooling apparatus 906 with a sufficient volume of cooling liquid prior to the apparatus 906 being placed into service in a data center. Method 300 may begin at step 302, which includes fluidly connecting the data center liquid cooling device provisioning system 200 to the liquid cooling apparatus 906. For example, the dripless disconnect of the outlet 210 is connected to the fluid inlet of the apparatus 906, and the dripless disconnect of the inlet 212 is connected to the fluid outlet of the apparatus 906.

Method 300 may continue at step 304, which includes operating the system 200 to circulate a flow of cooling liquid from the system 200 to the apparatus 906. For example, control system 999 may be initiated to operate the pump 206 to flow cooling liquid from the supply tank 204 through the filter 208 and toward the outlet 210. The check valve 209, in some aspects, may prevent a backflow of the cooling liquid (or other fluid) from the outlet 210 toward the pump 206. The pumped cooling liquid flows from the outlet 210 into the liquid cooling apparatus 906.

The solenoid valve labeled 218 is used during step 304. Initially in step 304, the solenoid valve 218 is left in an open position, thus allowing cooling liquid to flow into the waste tank 220 (e.g., from the supply tank 204, through the liquid cooling apparatus 906, and into the waste tank 220), thereby purging air from the liquid cooling apparatus 906. After a pre-determined time, for example, the solenoid labeled 218 is automatically closed. By closing the solenoid valve 218, and with the pump 206 continuing to run to flow cooling liquid into the liquid cooling apparatus 906, pressure increases in cooling liquid flow circuit 202.

Method 300 may continue at step 306, which includes determining a fill amount of the liquid cooling apparatus 906. For example, in some aspects, the sensor 222 may sense a fluid pressure at the inlet 212, which is in fluid communication with the liquid cooling device 906. Thus, the sensed fluid pressure at the inlet 212 may be the same as or substantially the same as the fluid pressure in the liquid cooling apparatus 906 during the fill operation. In some aspects, a particular fluid pressure measured by the sensor 222 may correspond to a particular fill level. For example, as described, by closing the solenoid valve 218, and with the pump 206 continuing to run to flow cooling liquid into the liquid cooling apparatus 906, pressure increases in cooling liquid flow circuit 202 and the liquid cooling apparatus 906 is pressurized (e.g., to a predetermined pressure measured by the sensor 222).

Method 300 may continue at step 308, which includes a determination of whether the fill level of the liquid cooling apparatus 906 is sufficient. For example, the pressure determined by the pressure sensor 222 may indicate (e.g., to the control system 999) that the liquid cooling apparatus 906 is sufficiently filled. In some aspects, the fluid pressure that corresponds to a sufficiently filled liquid cooling apparatus 906 is or is about a normal operating fluid pressure of the liquid cooling apparatus 906 in a data center cooling system. If the fill level is sufficient, method 300 proceeds to step 310. If the fill level is insufficient, then method 300 returns to step 304.

Method step 310 includes stopping the circulation of cooling liquid to liquid cooling apparatus. For example, the control system 999 may, based on the measured fluid pressure in step 306 indicating that the liquid cooling apparatus 906 is sufficiently filled, stop the pump 206 from flowing the cooling liquid from the supply tank 204 to the apparatus 906.

Method 300 may continue at step 312, which includes fluidly disconnecting the filled liquid cooling apparatus 906 from data center liquid cooling apparatus provisioning system 200. For example, the dripless disconnects on outlet 210 and inlet 212 may be disconnected from the liquid cooling apparatus 906. Cooling liquid that has been circulated into the liquid cooling apparatus 906 remains within the apparatus 906 (and the apparatus is now commissioned), while cooling liquid in the cooling liquid flow circuit 202 remains within the flow circuit 202.

In some aspects, method 300 may include other steps as well. For example, in some aspects, the liquid cooling apparatus 906 may become decoupled from the outlet 210 and/or the inlet 212 during the fill operations. Or in some aspects, the liquid cooling apparatus 906 may not have been properly secured to the outlet 210 and/or the inlet 212. In such cases, the dripless disconnects may not open to allow fluid flow therethrough. Thus, if the pump 206 is circulating cooling liquid from the supply tank 204 toward the outlet 210 in such situations, fluid pressure may uncontrollably build up in the liquid cooling flow circuit 202. In such cases, the check valve 216 may be set to a particular fluid pressure (e.g., 25 psi) that is indicative of this uncontrollable build up in the liquid cooling flow circuit 202. Upon reaching the set fluid pressure, check valve 216 allows cooling liquid to flow through the bypass line 214 to the cooling liquid waste tank 220 (e.g., a short circuit between supply tank 204 and waste tank 220).

As another example, in some aspects of method 300, some cooling liquid, as well as air, may be circulated from the supply tank 204, through the liquid cooling apparatus 906, and into the waste tank 220 during a fill operation. For example, air that resides within the liquid cooling apparatus 906 during a fill operation may be pushed out of the apparatus 906 and into the waste tank 220 by incoming cooling liquid circulated from the supply tank 204. Also, in order to reach the fill amount, some excess cooling liquid may be circulated into the waste tank 220 during the fill operation.

Figure 4:
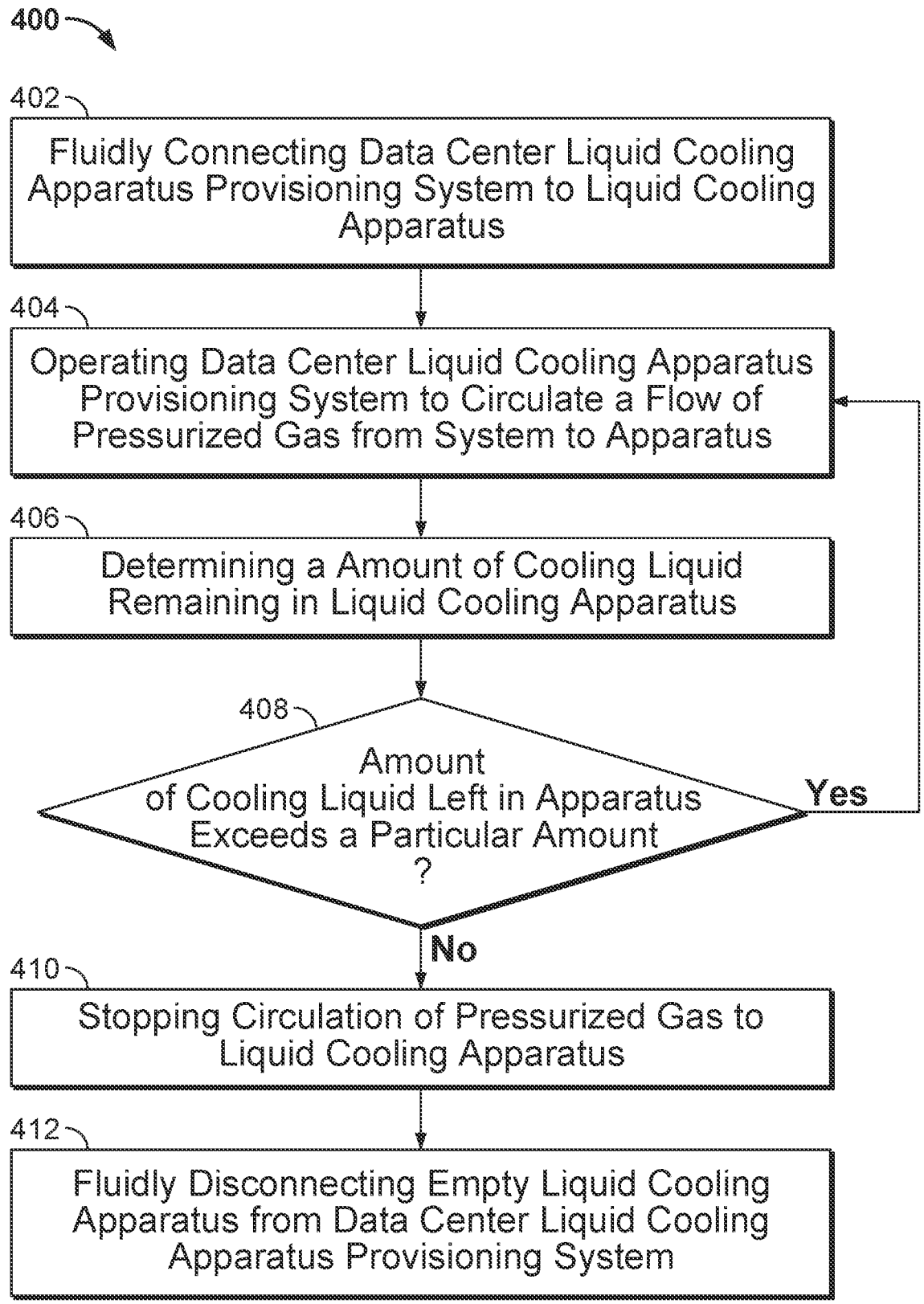
FIG. 4 illustrates another example method performed with a data center liquid cooling apparatus provisioning system according to the present disclosure.

Turning to FIG. 4, this figure illustrates another example method 400 performed with a data center liquid cooling apparatus provisioning system, such as the system 200. In some aspects, the method 400 may be performed by or with the control system 999. In some aspects, method 400 is an example of an evacuation or decommissioning operation, in which the system 200 is operated to evacuate the liquid cooling apparatus 906 of cooling liquid prior to the apparatus 906 being serviced or decommissioned. Method 400 may begin at step 402, which includes fluidly connecting the data center liquid cooling apparatus provisioning system 200 to the liquid cooling apparatus 906. For example, the dripless disconnect of the outlet 210 is connected to the fluid inlet of the apparatus 906, and the dripless disconnect of the inlet 212 is connected to the fluid outlet of the apparatus 906.

Method 400 may continue at step 404, which includes operating the data center liquid cooling apparatus provisioning system to circulate a flow of pressurized gas from the system 200 to the apparatus 906. For example, control system 999 may be initiated to operate the compressor 252 to flow pressurized gas through the regulator 254 and into the reservoir 262. Alternatively, the reservoir 262 may already hold a sufficient supply of pressurized gas (e.g., air). A flow of pressurized gas, in any event, is circulated through the check valve 264 (which prevents a backflow of gas and/or cooling liquid from the outlet 210) and through the outlet 210 into the liquid cooling apparatus 906.

In some aspects, step 404 also includes the control system 999 opening the solenoid valve 266 to allow the flow of pressurized gas to the outlet 210. In some aspects, this solenoid valve 266 is closed during a fill operation to, e.g., prevent cooling liquid from entering the pressurized gas evacuation sub-assembly 250 through the bypass line 214.

In some aspects, prior to step 404 or during step 404, the pressure sensor 260 may sense that an over-pressurization situation is occurring in the pressurized gas evacuation sub-assembly 250 (e.g., a gas pressure above 40 psi between the solenoid valve 256 and the gas reservoir 262). In such cases, solenoid valve 254 may close to prevent further over-pressurization. Additionally, the regulator 254 may be set to shut down the gas compressor 252 at a particular set pressure (e.g., a gas pressure about 40 psi).

In the event that the gas pressure within the pressurized gas evacuation sub-assembly 250 rises above such set pressures, pressure relief valve 258 may open (e.g., at 50 psi) to relieve the over-pressurization. Additionally, the regulator 254 may include a pressure relief valve (not specifically shown) that operates to open (e.g., at a particular pressure) to relieve the over-pressurization.

Method 400 may continue at step 406, which includes determining an amount of cooling liquid that remains in the liquid cooling apparatus 906. For example, as previously described, in some aspects, step 406 may continue until an operator visually determines if cooling liquid is flowing from the liquid cooling apparatus 906 to the waste tank 220.

Method 400 may continue at step 408, which includes a determination of whether the determined amount of cooling liquid left in the liquid cooling apparatus exceeds a particular amount. For example, as previously described, in some aspects, step 408 may continue until an operator visually determines if cooling liquid is flowing from the liquid cooling apparatus 906 to the waste tank 220. If flow continues, i.e., the determined amount exceeds the threshold level, then method 400 returns to step 404. If the determined amount of cooling liquid is below the threshold level, then method 400 proceeds to step 410.

Method step 410 includes stopping circulation of pressurized gas to the liquid cooling apparatus 906. For example, the control system 999 may stop the operation of the compressor 252. Alternatively or in addition, the control system 999 may close the solenoid valve 266. In some aspects, step 408 includes the control system 999 closing the solenoid valve 266, closing the solenoid valve 256, and shutting off the gas compressor 252 (in that order or in another order).

Method 400 may continue at step 412, which includes fluidly disconnecting the filled liquid cooling apparatus 906 from data center liquid cooling apparatus provisioning system 200. For example, the dripless disconnects on outlet 210 and inlet 212 may be disconnected from the liquid cooling apparatus 906.

Figure 5:
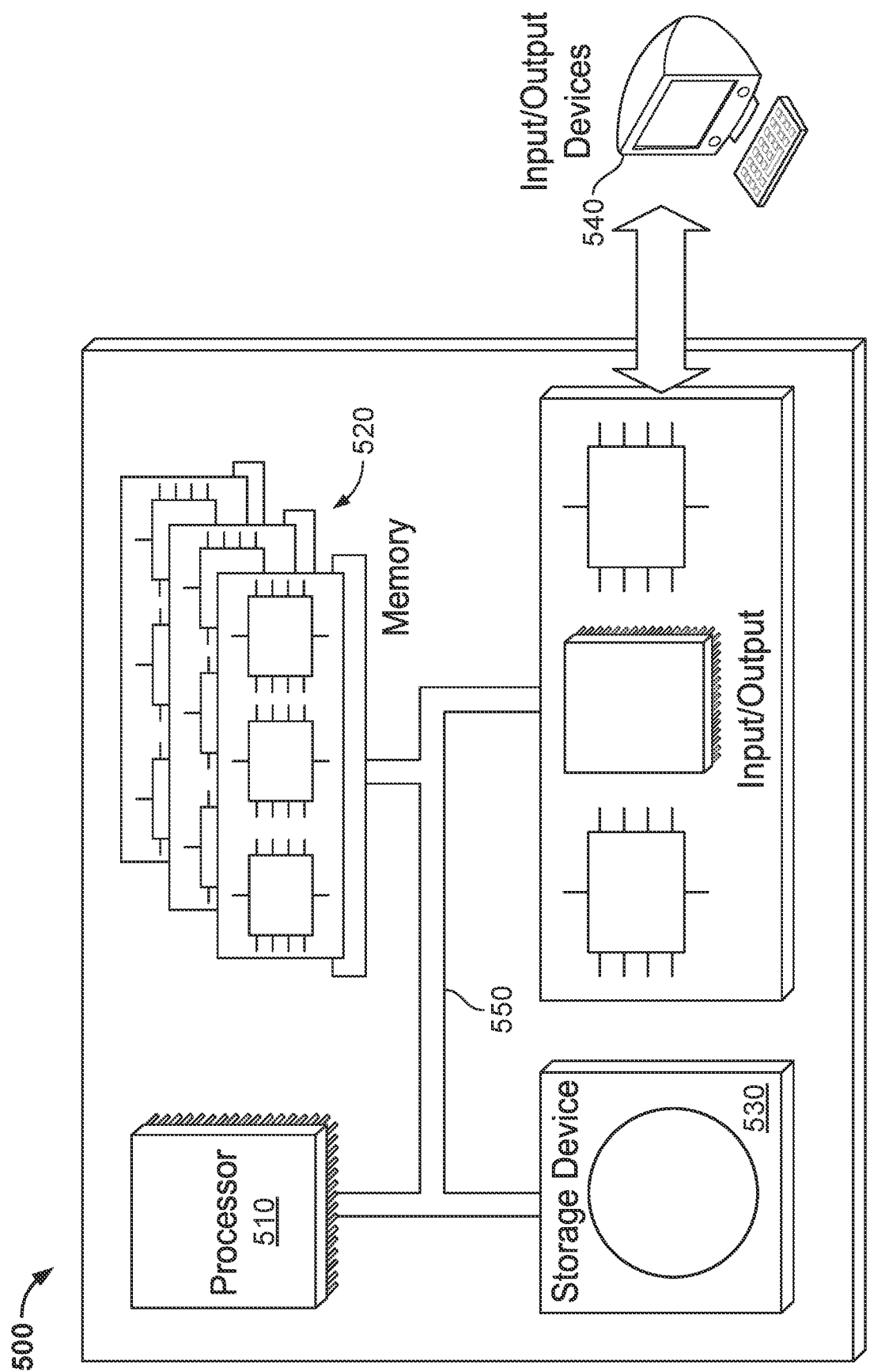
FIG. 5 illustrates a control system for an example implementation of a data center liquid cooling apparatus provisioning system according to the present disclosure.

FIG. 5 is a schematic diagram of a control system (or controller) 500 of a data center liquid cooling apparatus provisioning unit, such as the data center liquid cooling apparatus provisioning system 100 shown in FIG. 1 or the data center liquid cooling apparatus provisioning system 200 shown schematically in FIG. 2. The system 500 can be used for the operations described in association with any of the computer-implemented methods described previously, for example as or as part of the HMI 120 or control system 999 or other controllers described herein.

The system 500 is intended to include various forms of digital computers, such as laptops, desktops, workstations, personal digital assistants, servers, blade servers, mainframes, and other appropriate computers. The system 500 can also include mobile devices, such as personal digital assistants, cellular telephones, smartphones, and other similar computing devices. Additionally the system can include portable storage media, such as, Universal Serial Bus (USB) flash drives. For example, the USB flash drives may store operating systems and other applications. The USB flash drives can include input/output components, such as a wireless transmitter or USB connector that may be inserted into a USB port of another computing device.

The system 500 includes a processor 510, a memory 520, a storage device 530, and an input/output device 540. Each of the components 510, 520, 530, and 540 are interconnected using a system bus 550. The processor 510 is capable of processing instructions for execution within the system 500. The processor may be designed using any of a number of architectures. For example, the processor 510 may be a CISC (Complex Instruction Set Computers) processor, a RISC (Reduced Instruction Set Computer) processor, or a MISC (Minimal Instruction Set Computer) processor.

In one implementation, the processor 510 is a single-threaded processor. In another implementation, the processor 510 is a multi-threaded processor. The processor 510 is capable of processing instructions stored in the memory 520 or on the storage device 530 to display graphical information for a user interface on the input/output device 540.

The memory 520 stores information within the system 500. In one implementation, the memory 520 is a computer-readable medium. In one implementation, the memory 520 is a volatile memory unit. In another implementation, the memory 520 is a non-volatile memory unit.

The storage device 530 is capable of providing mass storage for the system 500. In one implementation, the storage device 530 is a computer-readable medium. In various different implementations, the storage device 530 may be a floppy disk device, a hard disk device, an optical disk device, or a tape device.

The input/output device 540 provides input/output operations for the system 500. In one implementation, the input/output device 540 includes a keyboard and/or pointing device. In another implementation, the input/output device 540 includes a display unit for displaying graphical user interfaces.

The features described can be implemented in digital electronic circuitry, or in computer hardware, firmware, software, or in combinations of them. The apparatus can be implemented in a computer program product tangibly embodied in an information carrier, e.g., in a machine-readable storage device for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor for displaying information to the user and a keyboard and a pointing device such as a mouse or a trackball by which the user can provide input to the computer. Additionally, such activities can be implemented via touchscreen flat-panel displays and other appropriate mechanisms.

The features can be implemented in a control system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include a local area network ("LAN"), a wide area network ("WAN"), peer-to-peer networks (having ad-hoc or static members), grid computing infrastructures, and the Internet.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

A number of embodiments have been described. Nevertheless, it will be understood that various modifications may be made without departing from the spirit and scope of what is described. For example, the steps of the exemplary flow charts in FIGS. 3 and 4 may be performed in other orders, some steps may be removed, and other steps may be added. Accordingly, other embodiments are within the scope of the following claims.

What is claimed is:

1. A data center liquid cooling apparatus provisioning system, comprising:
    a housing that defines a volume that is at least partially accessible through one or more openings of the housing;
    a cooling liquid flow circuit at least partially enclosed within the volume and comprising:
        a cooling liquid supply tank configured to store a volume of a cooling liquid;
        a pump coupled to the cooling liquid supply tank and coupled to an outlet configured to connect to a data center liquid cooling apparatus;
        a cooling liquid waste tank coupled to an inlet configured to connect to the data center liquid cooling apparatus; and
        a sensor in fluid communication with the cooling liquid flow circuit and configured to sense a liquid fill amount of the data center liquid cooling apparatus; and
    a control system communicably coupled to the cooling liquid flow circuit and configured to perform operations comprising:
        operating the pump to circulate a volume of the cooling liquid from the cooling liquid supply tank to the data center liquid cooling apparatus sufficient to at least fill the data center liquid cooling apparatus; and
        based on the sensor indicating that the fill amount of the data center liquid cooling apparatus is above a threshold value, stopping operation of the pump.

2. The data center liquid cooling apparatus provisioning system of claim 1, wherein the cooling liquid flow circuit further comprises at least one liquid filter positioned between the cooling liquid supply tank and the outlet.

3. The data center liquid cooling apparatus provisioning system of claim 2, wherein the data center liquid cooling apparatus comprises a liquid cold plate or evaporator configured to thermally couple to one or more data center heat generating devices.

4. The data center liquid cooling apparatus provisioning system of claim 3, wherein the cooling liquid flow circuit further comprises a first quick disconnect positioned at the outlet and a second quick disconnect positioned at the inlet.

5. The data center liquid cooling apparatus provisioning system of claim 4, wherein the control system is configured to perform operations further comprising:
    determining that the sensor indicates that the fill amount of the data center liquid cooling apparatus is below a threshold value;
    operating the pump to circulate at least a portion of the cooling liquid from the cooling liquid supply tank, through the data center liquid cooling apparatus, and into the cooling liquid waste tank; and
    based on the sensor indicating that the fill amount of the data center liquid cooling apparatus is above a threshold value, stopping operation of the pump.

6. The data center liquid cooling apparatus provisioning system of claim 4, further comprising a data center liquid cooling apparatus evacuation assembly fluidly coupled to the cooling liquid flow circuit, the data center liquid cooling apparatus evacuation assembly comprising:
    an air compressor;
    a pressurized air reservoir fluidly connected to the air compressor;
    an air outlet fluidly connected to the outlet of the cooling liquid flow circuit; and
    an air valve fluidly connected between the pressurized air reservoir and the air outlet.

7. The data center liquid cooling apparatus provisioning system of claim 6, wherein the control system is configured to perform operations further comprising:
    operating the air compressor to circulate pressurized air into the pressurized air reservoir; and
    operating the air valve to release pressurized air through the air outlet, through the outlet of the cooling liquid flow circuit, and into the data center liquid cooling apparatus.

8. The data center liquid cooling apparatus provisioning system of claim 7, wherein the cooling liquid waste tank is fluidly connected to the air outlet to receive a mixture of cooling liquid and pressurized air from the data center liquid cooling apparatus during flow of the released pressurized air.

9. The data center liquid cooling apparatus provisioning system of claim 2, wherein the cooling liquid flow circuit further comprises one or more one-way check valves configured to permit a flow of the cooling liquid through the cooling liquid flow circuit in a single direction, and a first check valve of the one or more check valves is positioned between a filter of the cooling liquid flow circuit and the inlet, and a second check valve of the one or more check valves is positioned between the inlet and the cooling liquid waste tank.

10. The data center liquid cooling apparatus provisioning system of claim 1, wherein the data center liquid cooling apparatus comprises a liquid cold plate or evaporator configured to thermally couple to one or more data center heat generating devices.

11. The data center liquid cooling apparatus provisioning system of claim 1, wherein the pump comprises a peristaltic pump.

12. The data center liquid cooling apparatus provisioning system of claim 1, wherein the cooling liquid flow circuit further comprises a first quick disconnect positioned at the outlet and a second quick disconnect positioned at the inlet.

13. The data center liquid cooling apparatus provisioning system of claim 1, wherein the control system is configured to perform operations further comprising:
　determining that the sensor indicates that the fill amount of the data center liquid cooling apparatus is below a threshold value;
　operating the pump to circulate at least a portion of the cooling liquid from the cooling liquid supply tank, through the data center liquid cooling apparatus, and into the cooling liquid waste tank; and
　based on the sensor indicating that the fill amount of the data center liquid cooling apparatus is above a threshold value, stopping operation of the pump.

14. The data center liquid cooling apparatus provisioning system of claim 1, wherein the sensor comprises a pressure sensor configured to measure a fluid pressure of the cooling liquid in at least one of the cooling liquid flow circuit or the data center cooling device.

15. The data center liquid cooling apparatus provisioning system of claim 1, wherein the control system is configured to perform operations further comprising:
　operating the pump to circulate the volume of the cooling liquid from the cooling liquid supply tank to the data center liquid cooling apparatus to evacuate at least a portion of a gas inside the data center liquid cooling apparatus into the cooling liquid waste tank.

16. The data center liquid cooling apparatus provisioning system of claim 1, wherein the cooling liquid flow circuit further comprises one or more one-way check valves configured to permit a flow of the cooling liquid through the cooling liquid flow circuit in a single direction.

17. The data center liquid cooling apparatus provisioning system of claim 16, wherein a first check valve of the one or more check valves is positioned between a filter of the cooling liquid flow circuit and the inlet, and a second check valve of the one or more check valves is positioned between the inlet and the cooling liquid waste tank.

18. The data center liquid cooling apparatus provisioning system of claim 1, further comprising a data center liquid cooling apparatus evacuation assembly fluidly coupled to the cooling liquid flow circuit, the data center liquid cooling apparatus evacuation assembly comprising:
　an air compressor;
　a pressurized air reservoir fluidly connected to the air compressor;
　an air outlet fluidly connected to the outlet of the cooling liquid flow circuit; and
　an air valve fluidly connected between the pressurized air reservoir and the air outlet.

19. The data center liquid cooling apparatus provisioning system of claim 18, wherein the control system is configured to perform operations further comprising:
　operating the air compressor to circulate pressurized air into the pressurized air reservoir; and
　operating the air valve to release pressurized air through the air outlet, through the outlet of the cooling liquid flow circuit, and into the data center liquid cooling apparatus.

20. The data center liquid cooling apparatus provisioning system of claim 19, wherein the cooling liquid waste tank is fluidly connected to the air outlet to receive a mixture of cooling liquid and pressurized air from the data center liquid cooling apparatus during flow of the released pressurized air.

\* \* \* \* \*